(12) United States Patent
Song et al.

(10) Patent No.: US 7,269,267 B2
(45) Date of Patent: Sep. 11, 2007

(54) METHOD OF MOUNTING CONDENSER MICROPHONE ON MAIN PCB AND CONDENSER MICROPHONE ADAPTED FOR THE SAME

(75) Inventors: Chung Dam Song, Seoul (KR); Eek Joo Chung, Gimpo-si (KR); Hyun Ho Kim, Incheon (KR)

(73) Assignee: BSE Co., Ltd. (KR)

( * ) Notice: Subject to any disclaimer, the term of this patent is extended or adjusted under 35 U.S.C. 154(b) by 346 days.

(21) Appl. No.: 10/964,506

(22) Filed: Oct. 13, 2004

(65) Prior Publication Data

US 2005/0094832 A1 May 5, 2005

(30) Foreign Application Priority Data

Nov. 5, 2003 (KR) ...................... 10-2003-0077967

(51) Int. Cl.
*H04R 25/00* (2006.01)
*H04R 9/08* (2006.01)
(52) U.S. Cl. ...................................... 381/174; 381/175
(58) Field of Classification Search ................ 381/361, 381/355, 174, 165, 175, 191, 396, 365
See application file for complete search history.

(56) References Cited

U.S. PATENT DOCUMENTS

| 6,108,432 | A  | * | 8/2000  | Watanabe ..................... 381/395 |
| 7,109,625 | B1 | * | 9/2006  | Jore et al. ..................... 310/198 |
| 2001/0043705 | A1 | * | 11/2001 | Wilmink ..................... 381/120 |
| 2005/0031150 | A1 | * | 2/2005  | Collins ........................ 381/355 |

* cited by examiner

*Primary Examiner*—Sinh Tran
*Assistant Examiner*—Stephen C Hung
(74) *Attorney, Agent, or Firm*—Keusey, Tutunjian & Bitetto, P.C.

(57) ABSTRACT

A condenser microphone and a method of mounting a condenser microphone on a main PCB are provided. The method includes assembling the condenser microphone by assembling elements of the condenser microphone such that a vibration plate including a diaphragm and a backplate is directed toward an opened surface of a casing of the condenser microphone. The casing has a closed bottom surface and an opened surface opposite to the closed bottom surface. A PCB includes a sound hole. The assembled condenser microphone is positioned on a main PCB such that the sound hole of the PCB is aligned in accordance with a through hole formed in the main PCB. According to the present invention, if necessary, the main PCB can be mounted such that its elements surface is directed toward an inside of an electronic product, thereby maintaining good sound quality due to a short delivery path of sound waves.

8 Claims, 4 Drawing Sheets

METHOD OF MOUNTING CONDENSER MICROPHONE ON MAIN PCB AND CONDENSER MICROPHONE ADAPTED FOR THE SAME

BACKGROUND OF THE INVENTION

1. Field of the Invention

The present invention relates to a method of mounting a condenser microphone, and more particularly, to a method of mounting a condenser microphone on a main printed circuit board (PCB) and a condenser microphone adapted for the method.

2. Description of the Related Art

Generally, customers desire high functionality and miniaturization of electronics products. Hence, manufacturers of electronic products are trying to make smaller products with to meet demand. Surface mount technology (SMT) may be used to miniaturize products, but the SMT cannot be used with elements having a weak resistance against temperature because a high temperature is applied to the parts during reflow of surface mount device (SMD).

Additionally, assuming that SMT is used, it is necessary to direct a front surface of the main PCB, on which elements are mounted, toward an inward direction of an electronic product during the mounting of the PCB to account for the thickness of the elements themselves.

However, in a conventional condenser microphone, it is difficult to mount a main PCB such that the front surface of the main PCB is directed toward an opposite direction of sound source, that is, such that the front surface is directed toward an inner space of a casing of the condenser microphone, because the casing has sound holes as shown in FIGS. 1A and 1B. If the front surface of the main PCB is mounted in the opposite direction of the sound source, sound quality decreases because the delivery path of sound waves increases.

FIG. 1A is a perspective view of a conventional condenser microphone mounted on a main PCB, and FIG. 2B is a side sectional view of a conventional condenser microphone mounted on a main PCB.

Referring to FIGS. 1A and 1B, a condenser microphone 10 includes a casing 12 having sound holes 12a. A PCB 14 of the condenser microphone 10 is mounted on a main PCB 20 and soldered such that connecting terminals 14a and 14b of the microphone 10 and bonded to a land area of the main PCB 20. To allow sound waves to be directly transferred to the microphone 10 from a sound source, it is necessary to mount the main PCB 20 such that an element surface 20a of the main PCB 20 is directed toward the sound source. To meet such a need, a space as much as the thickness of the element is required. Non-described reference numeral 20b indicates an opposite surface to the element surface of the main PCB 20.

SUMMARY OF THE INVENTION

Accordingly, the present invention is directed to a method of mounting a condenser microphone on a main PCB and condenser microphone adapted for the same that substantially obviates one or more problems due to limitations and disadvantages of the related art.

An object of the present invention is to provide a method of mounting a condenser microphone on a main PCB and condenser microphone for the same, in which the condenser microphone has sound holes formed in a PCB of the condenser microphone instead of the casing of the condenser microphone, and is mounted on a main PCB, and the main PCB is provided with a through hole so that the condenser microphone can be freely mounted on the main PCB.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method of mounting a condenser microphone on a main PCB. The method includes the steps of: assembling the condenser microphone by assembling elements of the condenser microphone such that a vibration plate including a coupling of a diaphragm and a backplate is directed toward an opened surface of a casing of the condenser microphone, the casing having a closed bottom surface and an opened surface opposite to the closed bottom surface, mounting a PCB having a sound hole on the casing and curling the opened surface of the casing such that a connecting terminal of the PCB is protruded compared to a curled surface; positioning the assembled condenser microphone on a main PCB such that the sound hole of the PCB of the condenser microphone is in accordance with a through hole formed in the main PCB; and soldering the connecting terminal of the condenser microphone to a landing of the main PCB.

According to another aspect of the present invention, there is provided a condenser microphone including: a barrel-shaped casing having a closed bottom surface and an opened opposite surface, the opened surface being curled; an insulation ring inserted onto the casing, for protecting interior elements from external heat and providing an insulation function; a first metal ring disposed in the insulation ring and contacting the bottom surface of the casing; a backplate disposed in the insulation ring and contacting the first metal ring; a spacer disposed in the insulation ring and contacting the backplate; a diaphragm inserted into the insulation ring to face the backplate, wherein the spacer is disposed between the diaphragm and the backplate; a polar ring disposed in the insulation ring, for supporting the diaphragm; a second metal ring disposed in the insulation ring, for supporting the polar ring and providing an electrical connection passage to the diaphragm; and a PCB electrically connected with the diaphragm and the backplate through the second metal ring and the casing respectively, the PCB having a sound hole and a connecting terminal protruding compared to a curled surface of the casing.

According to a further aspect of the present invention, there is provided a condenser microphone including: a barrel-shaped casing having a closed bottom surface and an opened opposite surface, the opened surface being curled; an insulation ring disposed in the casing, for protecting interior parts from external heat and providing an insulation function; a metal ring disposed in the insulation ring and contacting the bottom surface; a backplate disposed in the insulation ring and contacting the metal ring; a spacer disposed in the insulation ring and contacting the backplate; a diaphragm inserted in the insulation ring to face the backplate, wherein the spacer is disposed between the diaphragm and the backplate; a polar ring disposed in the insulation ring, for supporting the diaphragm; an integral base ring supporting the insulation ring and the polar ring, and having a conductive layer formed on an inner circumference thereof, for providing the diaphragm with an electrical connection through the polar ring; and a PCB electrically connected with the diaphragm and the backplate through the conductive layer and the casing respectively, the PCB having a sound hole and a connecting terminal protruding compared to a curled surface of the casing.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 1A:
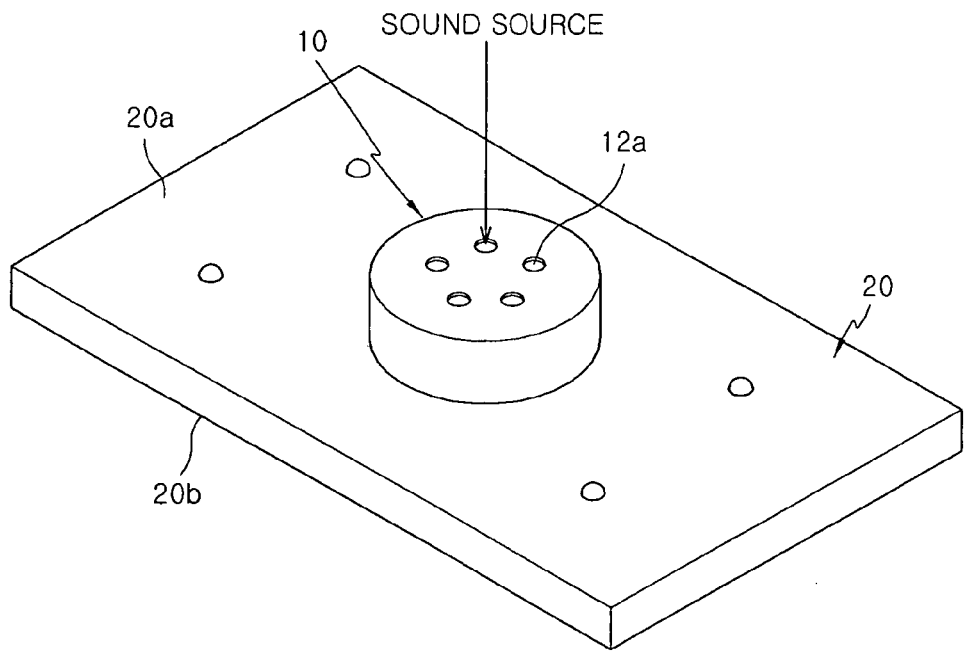
FIG. 1A is a perspective view of a conventional condenser microphone mounted on a main PCB.
Figure 1B:
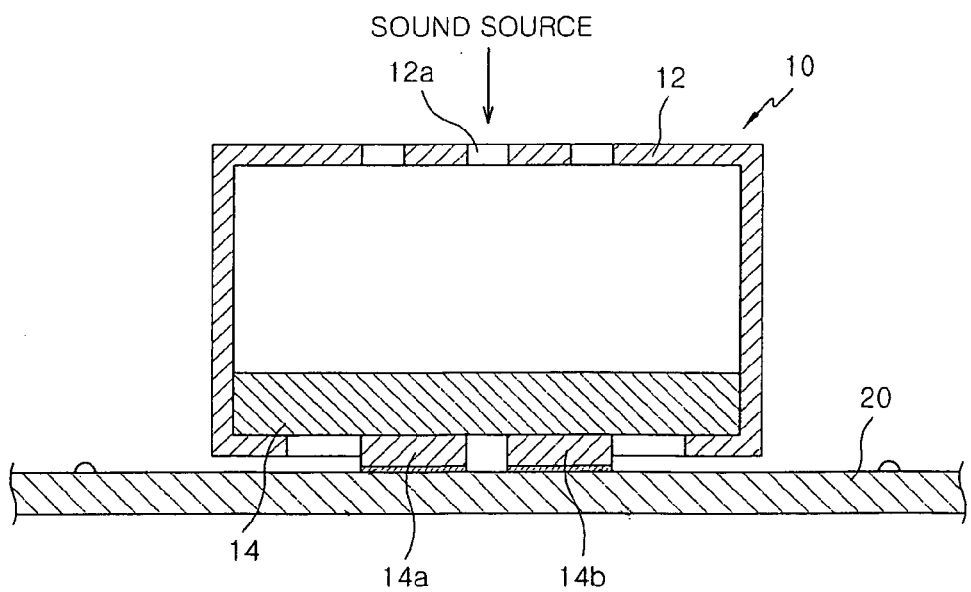
FIG. 1B is a side sectional view of a conventional condenser microphone mounted on a main PCB.
Figure 2A:
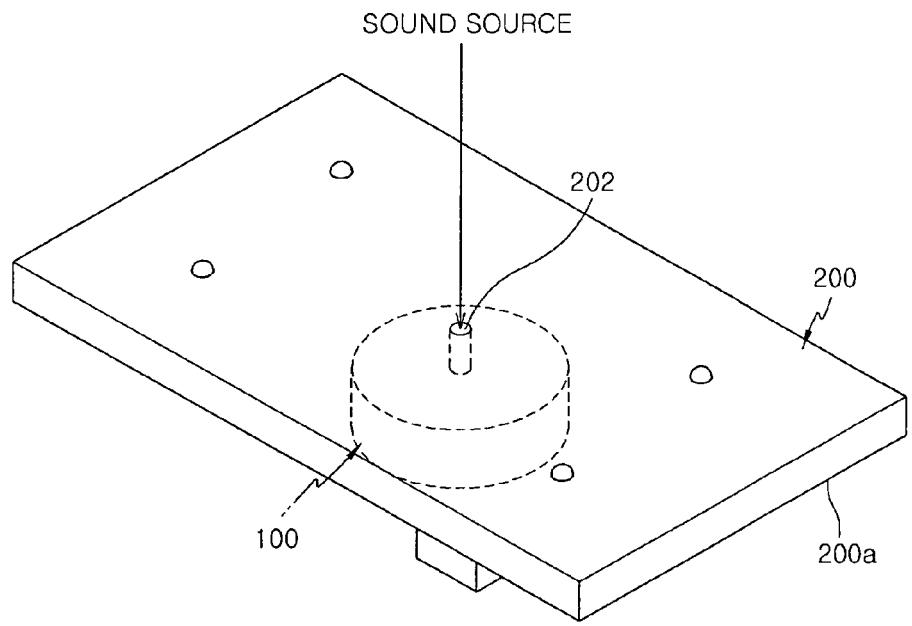
FIG. 2A is a perspective view of a condenser microphone mounted on a main PCB according to the present invention.
Figure 2B:
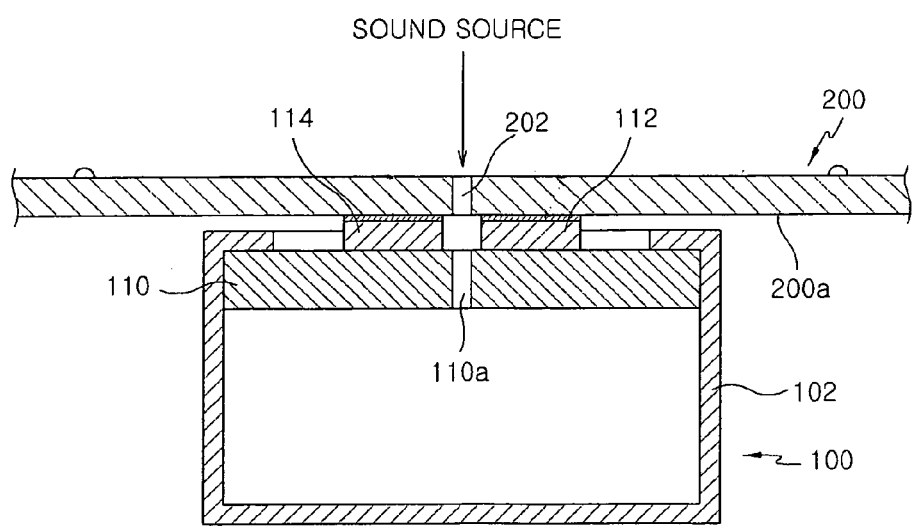
FIG. 2B is a side sectional view of a condenser microphone mounted on a main PCB according to the present invention.

FIG. 2A is a perspective view of a condenser microphone mounted on a main PCB according to one illustrative embodiment of the present invention, and FIG. 2B is a side sectional view of a condenser microphone mounted on a main PCB according to this embodiment of the present invention.

Referring to FIGS. 2A and 2B, a condenser microphone 100 according to the present invention is mounted on an element mounting surface 200a of a main PCB 200 around a through hole 202 formed in the main PCB 200 by an ordinary soldering method or a SMD reflow such that sound waves are delivered via the through hole 202. According to the mounting method as described above, since the main PCB 200 can be mounted such that the element surface 200a is directed toward an inner surface of the condenser microphone 100, there is needed a minimum space or thickness to mount the main PCB to electronic products like a portable phone, tape recorder and so on.

For this purpose, in FIG. 2B, the condenser microphone 100 has a sound hole 110a formed in a PCB 110 thereof not in a casing 102. The assembled condenser microphone 100 is seated on the element surface 200a of the main PCB 200 centering on the through hole 202 of the main PCB 200, and then connecting terminals 112 and 114 of the condenser microphone 100 are resoldered with a pattern (land) of the main PCB 200, thereby completing the mounting.

A sound wave from a sound source is delivered to the condenser microphone 100 through the through hole 202 of the main PCB 200 and the sound hole 110a formed in the PCB 110 of the condenser microphone 100. The sound wave delivered to an inner space (chamber) of the microphone 100 vibrates a diaphragm and thus a gap between the diaphragm and a backplate is varied such that an electrostatic capacity is varied and the sound wave is converted into an electrical signal. According to the above construction, although the main PCB 200 with the condenser microphone 100 mounted thereon is installed such that the element surface 200a thereof is directed toward an inside of an electronic product if necessary, the short delivery path of the sound wave from the sound source enables the maintenance of good sound quality.

FIG. 3 illustrates a condenser microphone adapted for applying the mounting method of the present invention to the SMD method.

Figure 3A:
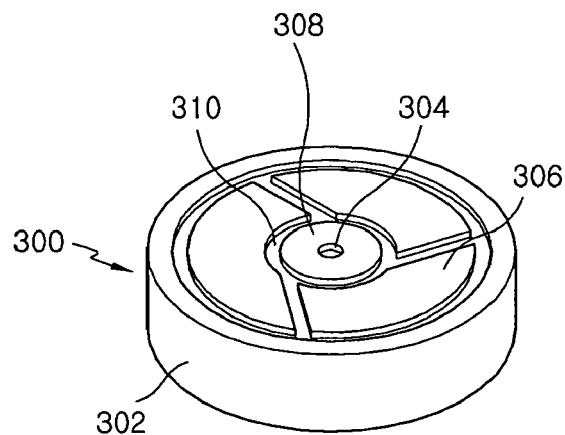
FIG. 3 is a view of a condenser microphone adapted for a method of mounting a condenser microphone according to the present invention.
Figure 3B:
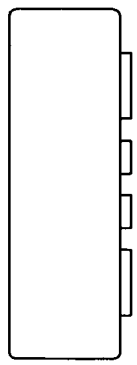
Figure 3C:
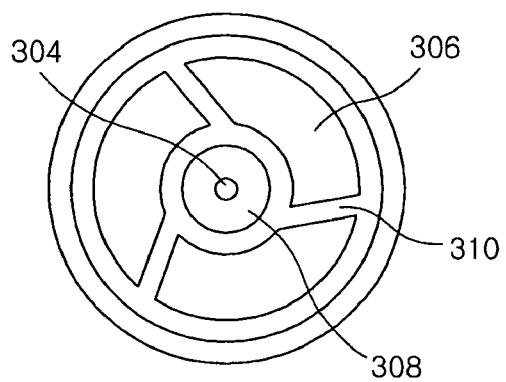

As shown in FIGS. 3A to 3C, a condenser microphone 300 has a sound hole 304, which is formed not at a casing 302 thereof but at a PCB 200, to be suitably mounted on a main PCB 200 by an SMD method. Connecting terminals 306 and 308 are protruded compared to a curled surface of the casing 302 and are preferably designed to include doughnut-shaped inner and outer circular plates. The doughnut-shaped outer circular plates of connecting terminals 306 preferably have three gas exhaust grooves 310 inclined outwardly in order to exhaust a gas generated during the SMD reflow process.

Figure 4:
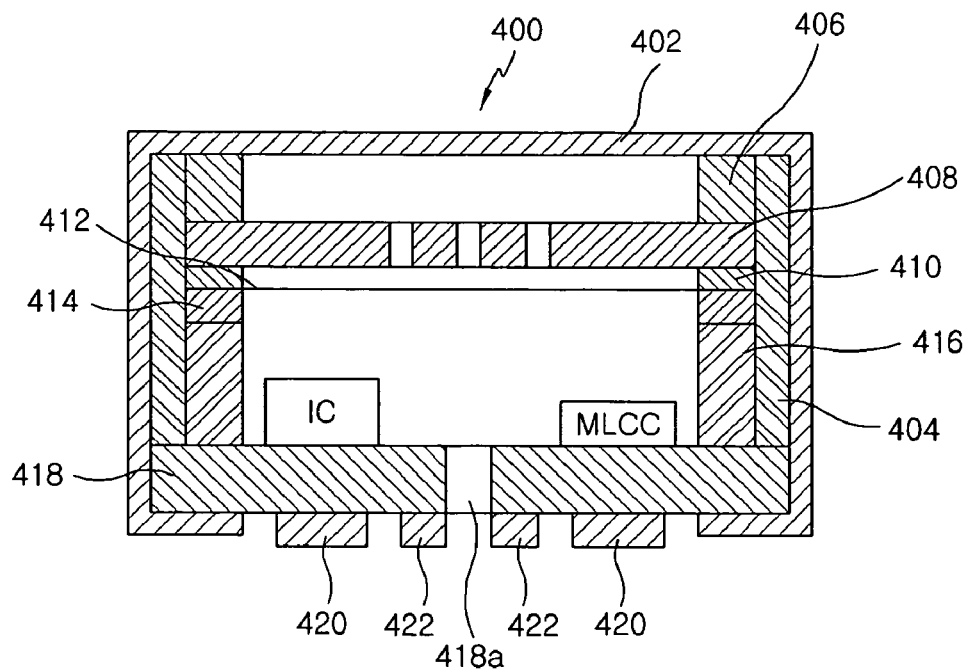
FIG. 4 is a side sectional view of a condenser microphone according to an embodiment of the present invention.

FIG. 4 is a side sectional view of a condenser microphone adapted to the present invention. The condenser microphone 400 includes a barrel-shaped casing 402 of which a bottom is closed and an opposite surface is opened, an insulation ring 404 made of heat resistant material and inserted in the casing 402 in order to protect inner elements from heat, and a PCB 418 formed with a sound hole 418a and an integrated circuit IC and a multi-layer ceramic chip capacitor MLCC mounted thereon. Inside the insulation ring 404 are disposed a first barrel-shaped metal ring 406, a backplate 408, a spacer 410, a diaphragm 412, a polar ring 414 and a second barrel-shaped metal ring 416.

Referring to FIG. 4, the backplate 408 is contacted and supported to the bottom surface of the casing 402 through the first metal ring 406. The diaphragm 412 is supported toward the PCB 418 by the polar ring 414 and the second metal ring 416. The PCB 418 is formed with the sound hole 418a in order to pass a sound wave from a sound source.

An electret material attached to the backplate 408, the spacer 410, the diaphragm 412 and the insulation ring 404 is made of heat resistant and chemical resistant materials such as fluororesins, polymers or plastics. That is, the above heat resistant materials enable using the SMD method to manufacture the microphone of the present invention, and m ay have various shapes, such as a film, a sheet or a roll or a bulk mass. In detail, the polymers (plastics) may include ASA, Nylon 6, Nylon 66, Nylon 46, LCP, PBT, PC, PC/ABS, PC/PBT, PEEK, PEN, PES, PET, PMMA, POM, PTFE, SAN, PPS, SBR, TPU and so on, and the fluororesins may include PTFE (TFE), FEP, PFA, ETFE, CTFE, PVDF, PVE, PCTFE, ECTFE, EPE, Nylon 6, PP, hard PVC and so on. The materials cited herein employ their abbreviated names for simplicity.

During the SMD reflow process, a heat resistant cream solder may be used in order to protect the elements (IC, MLCC) attached on the PCB 418 from breakaway. The cream solder may include Sn/Ag, Sn/Cu, Sn/Ag/Cu, Sn/Ag/Cu/Sb (The CASTING™ Alloy), Sn/Ag/Cu/Bi (The OATEY™ Alloy) and so on.

Meanwhile, as shown in FIG. 3, connecting terminals 420 and 422 of the PCB 418 are protruded compared to a curled (or bent) surface of the casing 402 (that is, terminals 420 and 422 extend past the casing thickness of casing 402) such that the microphone 400 can be mounted on the main PCB 200 (for example, a main PCB for a portable phone) using an SMD method. The connecting terminals 420 and 422 include a circular terminal 422 formed at an inner portion of the PCB 418 in order to provide a supply voltage (Vdd) connection, and circular ground terminals 420 (for ground GND) are spaced a way from each other and formed at an outer periphery of the PCB 418. The terminal 420 has three gas exhaust grooves 310 for exhausting gas generated during the SMD bonding process.

Operation of the condenser microphone constructed as above will now be described.

When Vdd and GND voltages are applied to the connecting terminals 420 and 422 of the microphone 400 connected to the main PCB 200, the microphone 400 operates. The diaphragm 412 is electrically connected to the PCB 418 by the polar ring 414 and the second metal ring 416, and the backplate 408 is electrically connected to the PCB 418 by the first metal ring 406 and the casing 402.

A sound wave created by a user passes through the through hole 202 (FIG. 2B) of the main PCB 200 and the sound hole 418a of the PCB 418. Then, the sound wave that has passed through the holes vibrates the diaphragm 412, so that a gap between the diaphragm 412 and the backplate 408 is varied. Owing to the variation of the gap, an electrostatic capacity formed by the diaphragm 412 and the backplate 408 is varied, thereby obtaining electrical signals (voltage) corresponding to a variation of the sound wave. The signals are applied to the IC of the PCB 418 through the electrical connection path described above, amplified and delivered to the main PCB 200 through the connecting terminals 420 and 422.

Figure 5:
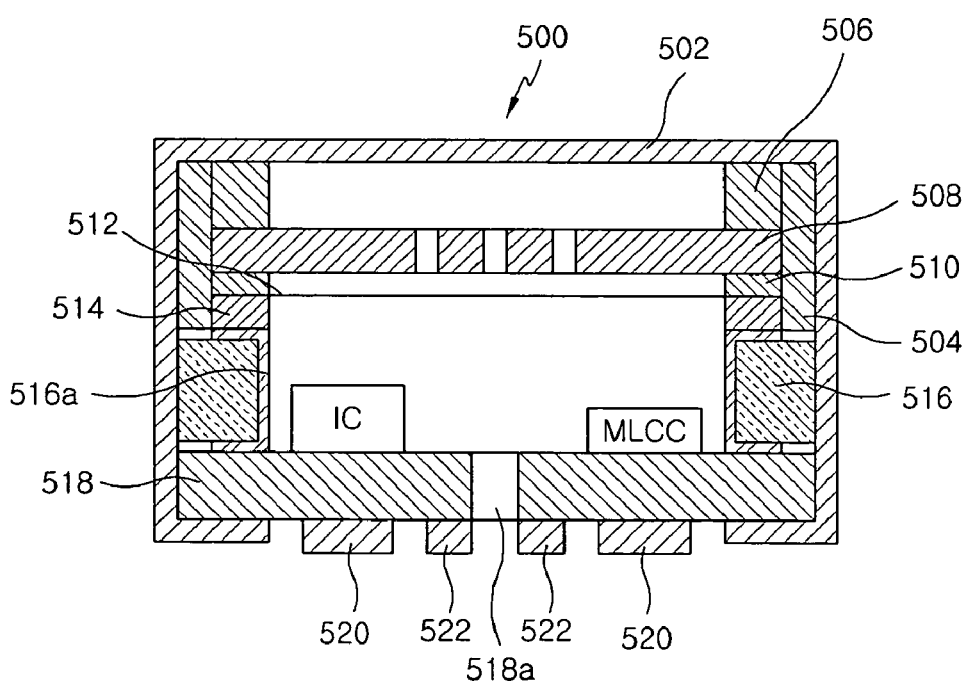
FIG. 5 is a side sectional view of a condenser microphone according to another embodiment of the present invention.

FIG. 5 is a side sectional view of a condenser microphone adapted to the present invention in accordance with another illustrative embodiment. The condenser microphone 500 includes a casing 502 having a closed bottom surface and an opened surface opposite to the bottom surface, an insulation ring 504 formed of heat resistant material and inserted in the casing 502 and an integral base ring 516. A metal ring 506, a backplate 508, a spacer 510, a diaphragm 512 and a polar ring 514 are disposed inside the insulation ring 504. The insulation ring 504 and the polar ring 514 are supported by the integral base ring 516 toward the PCB 518. The diaphragm 512 and the polar ring 514 can be made integrally. A conductive layer 516a is formed on an inner circumference of the integral base ring 516 in order to electrically connect the diaphragm 512 and the PCB 518 through the polar ring 514. The PCB 518 is formed with a sound hole 518a and elements (IC, MLCC) mounted thereon.

Operation of the condenser microphone according to the present invention will now be described.

When Vdd and GND voltages are applied to connecting terminals 520 and 522 connected to the main PCB 200, the microphone 500 operates. The diaphragm 512 is electrically connected to the PCB 518 via the polar ring 514 and the conduction layer 516a of the integral base ring 516, and the backplate 508 are electrically connected to the PCB 518 via the metal ring 506 and the casing 502.

A sound wave created by a user passes through the through hole 202 of the main PCB 200 and the sound hole 518a of the PCB 518. The sound wave that has passed through the holes vibrates the diaphragm 512, so that a gap between the diaphragm 512 and the backplate 508 is varied. Owing to the variation of the gap, an electrostatic capacity formed by the diaphragm 512 and the backplate 508 is varied, thereby obtaining electrical signals (voltage). The signals are applied to the IC of the PCB 518 through the electrical connection path described above, amplified and delivered to the main PCB 200 through the connecting terminals 520 and 522.

As described above, the microphone according to the present invention has a sound hole, which is formed in the PCB not in the casing such that the microphone is operated by a pressure of a sound wave introduced through a through hole of the main PCB, whereby the main PCB can be mounted with various choices. That is, if necessary, the main PCB can be mounted such that elements on its surface are directed toward an inside of an electronic product, thereby maintaining good sound quality as a result of a short delivery path of sound wave.

It will be apparent to those skilled in the art that various modifications and variations can be made in the present invention. Thus, it is intended that the present invention covers the modifications and variations of this invention provided they come within the scope of the appended claims and their equivalents.

What is claimed:

1. A method for mounting a condenser microphone on a main printed circuit board (PCB), the method comprising the steps of:
    assembling the condenser microphone by assembling elements of the condenser microphone such that a vibration plate including a diaphragm and a backplate is directed toward an opened surface of a casing of the condenser microphone, the casing having a closed bottom surface and an opened surface opposite to the closed bottom surface, mounting a PCB having a sound hole on the casing and forming the opened surface of the casing such that a connecting terminal of the PCB extends beyond the casing adjacent to the opened surface;
    positioning the assembled condenser microphone on a main PCB such that the sound hole of the PCB of the condenser microphone is in accordance with a through hole formed in the main PCB; and
    soldering the connecting terminal of the condenser microphone to the main PCB.

2. A condenser microphone adapted to be mounted on a main printed circuit board (PCB), comprising:
    a barrel-shaped casing having a closed bottom surface and an opened opposite surface, the opened surface being curled;
    an insulation ring inserted onto the casing, for protecting interior elements from external heat and providing an insulation function;
    a first metal ring disposed in the insulation ring and contacting the bottom surface of the casing;
    a backplate disposed in the insulation ring and contacting the first metal ring;
    a spacer disposed in the insulation ring and contacting the backplate;

a diaphragm inserted into the insulation ring to face the backplate, wherein the spacer is disposed between the diaphragm and the backplate;
a polar ring disposed in the insulation ring, for supporting the diaphragm;
a second metal ring disposed in the insulation ring, for supporting the polar ring and providing an electrical connection passage to the diaphragm; and
a PCB internally mounted in the casing and electrically connected with the diaphragm and the backplate through the second metal ring and the casing respectively, the PCB having a sound hole and a connecting terminal extending past a curled surface of the casing.

3. The condenser microphone of claim 2, wherein the connecting terminal comprises a first circular terminal formed on a central portion of the PCB, a second circular terminal formed on an edge of the PCB and spaced apart by a predetermined distance from the first circular terminal, the second circular terminal having a gas exhaust groove for exhausting a gas generated by a surface mount device (SMD) bonding process.

4. The condenser microphone of claim 2, wherein the main PCB has a through hole for delivering sound waves.

5. A condenser microphone adapted to be mounted on a main printed circuit board (PCB), comprising:
a barrel-shaped casing having a closed bottom surface and an opened opposite surface, the opened surface having edges curled to form a curled surface in the casing;
an insulation ring disposed in the casing, for protecting interior parts from external heat and providing an insulation function;
a metal ring disposed in the insulation ring and contacting the bottom surface;
a backplate disposed in the insulation ring and contacting the metal ring;
a spacer disposed in the insulation ring and contacting the backplate;
a diaphragm inserted in the insulation ring to face the backplate, wherein the spacer is disposed between the diaphragm and the backplate;
a polar ring disposed in the insulation ring, for supporting the diaphragm;
an integral base ring supporting the insulation ring and the polar ring, and having a conductive layer formed on an inner circumference thereof, for providing the diaphragm with an electrical connection through the polar ring;
the a PCB internally disposed in the casing and electrically connected with the diaphragm and the backplate through the conductive layer and the casing respectively, the PCB having a sound hole and a connecting terminal extending past the curled surface of the casing.

6. The condenser microphone of claim 5, wherein the connecting terminal comprises a first circular terminal formed on a central portion of the PCB, a second circular terminal formed on an edge of the PCB and spaced apart by a predetermined distance from the first circular terminal, the second circular terminal having a gas exhaust groove for exhausting a gas generated by a surface mount device (SMD) bonding process.

7. The condenser microphone of claim 5, wherein the main PCB has a through hole for delivering sound waves.

8. The condenser microphone of claim 5, wherein the diaphragm is formed integrally with the polar ring.

* * * * *